United States Patent
Kobayashi

(10) Patent No.: US 6,728,652 B1
(45) Date of Patent: Apr. 27, 2004

(54) METHOD OF TESTING ELECTRONIC COMPONENTS AND TESTING APPARATUS FOR ELECTRONIC COMPONENTS

(75) Inventor: Yoshihito Kobayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/376,301

(22) Filed: Aug. 18, 1999

(30) Foreign Application Priority Data

Aug. 20, 1998 (JP) .......................................... 10-233862

(51) Int. Cl.[7] .............................................. G06F 19/00
(52) U.S. Cl. ....................... 702/117; 702/118; 702/120; 714/724; 714/720; 714/729
(58) Field of Search ................................ 714/724, 726, 714/729; 702/117, 118, 120

(56) References Cited

U.S. PATENT DOCUMENTS 5,754,559 A * 5/1998 Nevill .......................... 714/25
5,794,175 A * 8/1998 Conner ..................... 324/158.1
6,055,657 A * 4/2000 Heo et al. ..................... 714/724

* cited by examiner

*Primary Examiner*—John Barlow
*Assistant Examiner*—Stephen J. Cherry
(74) *Attorney, Agent, or Firm*—Birch, Stewart, Kolasch & Birch, LLP

(57) ABSTRACT

A method of judging whether an electronic component is good or defective in accordance with a response output signal by inputting a test signal to the IC to be tested, wherein a common test signal is input to respective electronic devices A1 and A2 of a group of electronic devices composed of a plurality of electronic devices, and in accordance with a response signal thereof, the group of electronic devices as a whole subjected to the test is judged to be good or defective. In the second test, each of the DUTs A1 and A2 of the group of electronic devices judged to be defective is input a mutually independent test signal, and in accordance with the response signal thereof, it is judged whether each of the electronic devices A1 and A2 subjected to the test is good or defective.

2 Claims, 14 Drawing Sheets

METHOD OF TESTING ELECTRONIC COMPONENTS AND TESTING APPARATUS FOR ELECTRONIC COMPONENTS

BACKGROUND OF THE INVENTION

1. Field of the Invention

The present invention relates to a testing apparatus for a variety of electronic components, such as semiconductor integrated circuit devices (hereinafter simply referred to as an "IC" or "ICs") and a method of testing electronic components, and especially relates to a method of testing electronic components which can increase the number of electronic components to be simultaneously tested even if the number of terminals on a test head side is small and a testing apparatus for electronic components.

2. Description of the Related Art

A testing apparatus for electronic components, called a "handler", conveys a large number of ICs held on a tray to the inside of a testing apparatus where the ICs are pressed against socket terminals connected to a test head, then the IC testing unit (tester) is made to perform the test. When the test is ended, the ICs are conveyed out from the test procedure and reloaded on trays in accordance with the results of the tests so as to classify them into categories of good ICs and defective ones.

In a handler of the related art, there are some types wherein trays for holding the ICs to be tested or the tested DUTs (hereinafter referred to the "customer trays") and trays conveyed circulating inside the handler (hereinafter referred to as the "test trays") are different, therefore, in such types of handlers, the ICs are switched between the customer trays and the test trays before and after the test, and in the testing processing wherein tests are carried out by contacting the ICs to the socket terminals, ICs are pressed against the test head while being carried on the test trays.

In such handlers, it is considered that the faster the processing speed is and the larger the number of ICs to be tested is in a certain period of time (meaning "throughput" of the testing apparatus), the more preferable, however, as shown in FIG. 14, the throughput is substantially proportional to the number of ICs simultaneously pressed against the socket of the test head, that is the simultaneously tested number when in a specification requiring a longer testing time (often the case with, for example, memory ICs). For example, as shown in the same figure, in a range where the time for testing is longer, throughput of handlers of simultaneously testing 64 ICs becomes twice as much as that of the handlers of simultaneously testing 32 ICs. Accordingly, when the simultaneously tested numbers of ICs is increased, the through-put can be higher.

In order to increase the simultaneously tested numbers of ICs, however, the number of the terminals on the test head side has to be increased along with it. Thus, a test head of the related art could not be used as it was.

FIG. 13 is a schematic view of the connection relationship of the test head terminals and the socket terminals in a test procedure. In handlers of the related art, terminals on the test head side were separately provided for each of driver pins and input/output pins of the ICs (DUTs: Device Under Test). Therefore, the number of ICs capable of being simultaneously tested on the handler side is restricted by the number of the terminals on the test head side. In other words, the number of terminals on the test head side has decided the limit of the number of ICs of handlers simultaneously tested.

SUMMARY OF THE INVENTION

An object of the present invention is to provide a method of testing electronic components which can increase the number of ICs to be simultaneously tested even if the number of terminals on the test head side is small and a testing apparatus for electronic components.

(1-1) According to a first aspect of the present invention, there is provided a method of testing electronic components to judge whether the electronic component is good or defective in accordance with a response output signal by inputting a test signal to the electronic component to be tested including: a first test step of inputting a common test signal to the respective electronic components of a group of electronic components composed of a plurality of electronic components and judging in accordance with a response signal thereof whether the group of electronic component subjected to the test is good or defective as a whole; a second test step of inputting mutually independent test signals to the respective electronic components of a group of electronic components judged to be defective in the first test step and judging in accordance with a response signal thereof each of the electronic components subjected to the test is good or defective.

In the present invention, tests are carried out on a group of electronic components composed of a plurality of electronic components by using a common test signal in a first test step to detect whether the whole group of the electronic components is good or defective. At this time, when a correct response output signal can be obtained as the whole group of electronic components, all of the electronic components composing the group are judged good regardless of the fact that the test signal is common or not. Inversely, when an abnormal response output signal is obtained as the whole group, which one of the electronic components composing the group is good or defective cannot be specified. Therefore, in the present invention, a second test step is provided.

Namely, in the second test step, the electronic components composing a group of electronic components judged to be defective in the first test step are respectively input mutually independent test signals, not a common test signal. Then, in accordance with the response signal, each of the electronic components subjected to the test is judged to be good or defective. In this way, it is possible to detect which of the electronic components is good or defective in the group judged to be defective.

As a result, it is possible to perform tests simultaneously on a plurality of electronic components by using terminals on one test head side, and to increase the number of electronic components to be simultaneously tested without increasing the number of terminals of the test head.

The testing method of electronic components is especially efficient in the case where the rate of good electronic components is high because the separate tests in units of an electronic component have to be carried out only when a group of electronic components is judged to be defective.

As kinds of test signals according to the present invention is not specifically limited, and, for example, in a memory IC, in addition to address specifying signals input from the driver terminals, input signals input from the input terminals are also included.

(1-2) In the above invention, the second test step may be placed immediately after the first test step, or instead of this, a step of rearranging electronic components judged to be defective in the first test step and a step of conveying the rearranged electronic components to the second test step may be included between the first test step and the second test step.

(1-3) In the above invention, an input form of a commonly input test signal in the first test step is not specifically limited and, for example, it is input in parallel from a common terminal of a test head to respective electronic components of the group of electronic component.

Also, instead of this, as an input form of a test signal commonly input in the first test step, it is selectively input from a common terminal of a test head to respective electronic components of the group of electronic component.

In the former input form, by dividing a terminal circuit (for example a socket board) on the socket side, it is possible to simultaneously carry out tests on a plurality of electronic components by using the terminals no one test head side. While in the latter input form, by dividing the terminal circuit (for example a performance board) on the test head side, it is possible to carry out tests on a plurality of electronic components by using terminals on one test head side. In both cases, when either one of the socket side or the test head side is changed, the other side can be used as it is.

(1-4) Note that a test signal of the first test step may include a second test signal mutually independently input to respective electronic components of the electronic component group.

Also, an response output signal output mutually independently from the respective electronic components in the group of electronic components may be included in the response output signal in the first test step.

The gist of the present invention is to increase the number of electronic components simultaneously tested without increasing the number of terminals on the test head side by making test signals, which can be made common, common as much as possible. In that sense, it does not aim to make test signals common, for example, testing signals necessary for judging good or defective of a group of electronic components, which cannot be made common.

(1-5) In the method of testing electronic components of the present invention, the number of electronic signals simultaneously tested in the first and second test steps is not specifically limited and any number may be included. Especially, it is preferable that N number of electronic components are simultaneously tested in the first test step and N/2 number of electronic components are simultaneously tested in the second test step (note that N is a natural number). For example, 64 electronic components are simultaneously tested in the first test step and 32 electronic components are simultaneously tested in the second test step. In the same way, when 128, 32, 16 electronic components are simultaneously tested in the first test step, 64, 16, 8 electronic components are simultaneously tested in the second step. These numbers depend on the number of electronic components composing one group of electronic components.

(2-1) To attain the above object, according to a second aspect of the present invention, there is provided an electronic component testing apparatus having an IC socket, one end of which is connected to an electronic component to be tested and the other end is connected to a terminal of a test head, comprising a circuit for combining in parallel terminals of at least two IC sockets on the electronic component side with respect to at least one terminal of the test head.

In the present invention, since at least one terminal of a test head is provided with a circuit for dividing in parallel the terminals on the electronic component side of at least two IC sockets, when tests are carried out by using the above method for testing electronic components of the present invention, the number of electronic components to be simultaneously tested can be increased without increasing the number of terminals of the test head.

(2-2) The dividing circuit according to the present invention is not specifically limited and may be provided on the IC socket side or on the test head side. When providing the dividing circuit on the test head side, it is preferable that a switch is provided in the dividing circuit.

In either case, wherein the dividing circuit is provided on the IC socket side or the test head side, a plurality of electronic components can be tested by using terminals of one test head side, and in both cases, when either one of the IC socket side or the test head side is changed, the other can be used as it is.

(2-3) In the present invention, it is preferable to comprise a mechanism for simultaneously connecting a plurality of electronic components to terminals of electronic component side of the IC socket of a plurality of electronic components, obtaining test results for a group of IC sockets provided with the dividing circuit, rearranging a group of electronic components judged to be defective so as to correspond one electronic component to one group of the IC sockets.

By providing a reinspection mechanism for performing reinspection to a group of electronic components judged to be defective after completing tests as a group of electronic components, final judgement of whether each of the electronic components is good or defective can be automatically made.

(3) In the method of testing electronic components and an electronic component testing apparatus of the present invention, the number of electronic components composing a group of electronic components is not specifically limited and all natural numbers of two or more are included. Also, the larger the number of electronic components to be simultaneously tested in the first and second test steps are, such as 16, 32, 64, 128, etc., the higher the throughput becomes, so the more preferable it becomes. However, the number is not limited to the above and includes all natural numbers of two or more are included.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will be explained in more detail with reference to the attached drawings, which are given by way of illustration only, and thus are not limitative of the present invention, and wherein.

DESCRIPTION OF THE PREFERRED EMBODIMENTS

Figure 3:
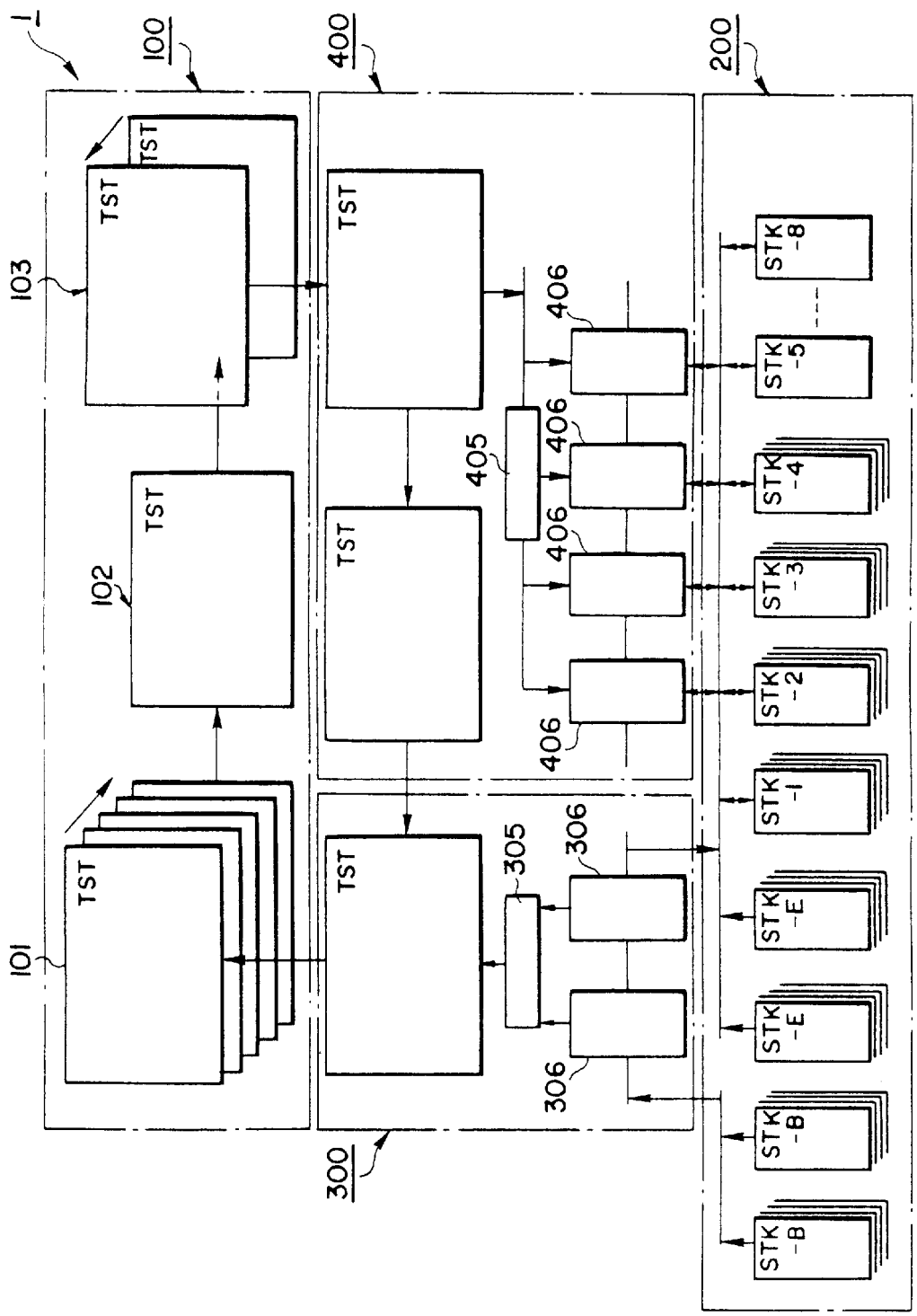
FIG. 3 is a conceptual view of a method of handling electronic components in the electronic component testing apparatus shown in FIG. 1.

FIG. 3 is a view for understanding a method of handling an ICs to be tested in the electronic device testing apparatus 1 of the present embodiment and partially shows by a plan view members actually arranged aligned in the vertical direction. Therefore, the mechanical (three-dimensional) structure will be explained with reference to FIG. 1.

First, the overall configuration of an electronic device testing apparatus of the present embodiment will be generally explained with reference to FIG.1 to FIG. 3. The electronic device testing apparatus 1 of the present embodiment comprises, as shown in the same figures, a handler 1 for handling ICs to be tested, a test head 5 which is electronically contacted by the ICs to be tested, and a tester 6 for sending a test signal to the test head 5 to perform tests on the ICs to be tested.

Among those, the handler 1 comprises a chamber section 100 to which the test head 5 is attached, an IC magazine 200 which holds the ICs to be tested or classifies and stores the tested ICs, a loader section 300 which sends the DUTs into the chamber section 100, and an unloader section 400 for classifying and taking out tested DUTs which had been tested in the chamber section 100.

Note that in the explanation below, an example of a handler 1 of so-called chamber form which uses a constant temperature chamber to give a thermal stress to the DUTs will be described for explaining the present invention, however, the present invention is not limited by forms of thermal stress given to the ICs and can be applied to other handlers, as well.

The electronic device tasting apparatus 1 is an apparatus for testing (inspecting) whether an IC is operating suitably in a state applying a high temperature or low temperature thermal stress to the IC, and classifies the ICs in accordance with the test results. The operating test in the state with thermal stress applied is performed by reloading the ICs from a customer tray KST carrying a large number of ICs to be tested to a test tray TST conveyed through the inside of the electronic devices testing apparatus 1.

The test tray TST is loaded with the ICs to be tested in the loader section 300 and then conveyed to the chamber section 100. The ICs are tested in the chamber section 100 in the state being carried on the test tray TST. Then, after the tested ICs are conveyed out to the unloader section 400, where the ICs are reloaded to the customer trays in accordance with the results of the tests.

The chamber section 100 comprises a constant temperature chamber (soak chamber) 101 for giving a desired high temperature or low temperature thermal stress to the ICs to be tested carried on the test tray TST, a test chamber 102 for making the ICs contact the test head in a state given the thermal stress by the constant temperature chamber 101, and an unsoak chamber 103 for removing the given thermal stress from the ICs tested in the test chamber 102.

In the unsoak chamber 103, when a high temperature was applied in the constant temperature chamber, the ICs to be tested are cooled by blowing in air to return them to room temperature. Alternatively, when a low temperature of, for example, about −30° C. has been applied in the constant temperature chamber 101, it heats the DUTs by hot air or a heater etc. to return them to a temperature where no condensation occurs. Next, the thus treated DUTs are conveyed out to the unloader section 400.

Chamber Section 100

Figure 1:
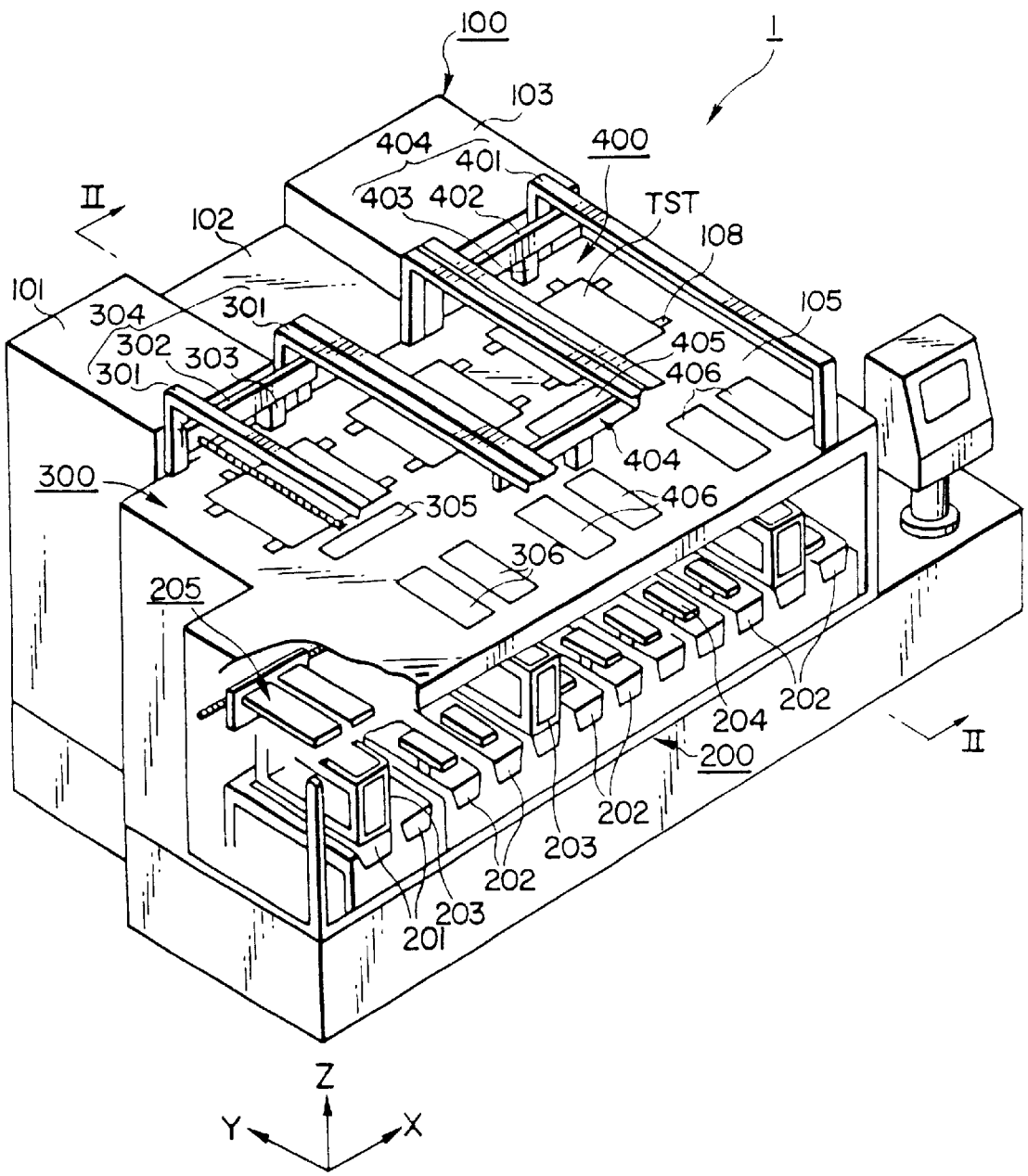
FIG. 1 is a perspective view of an embodiment of an electronic component testing apparatus of the present invention.
Figure 2:
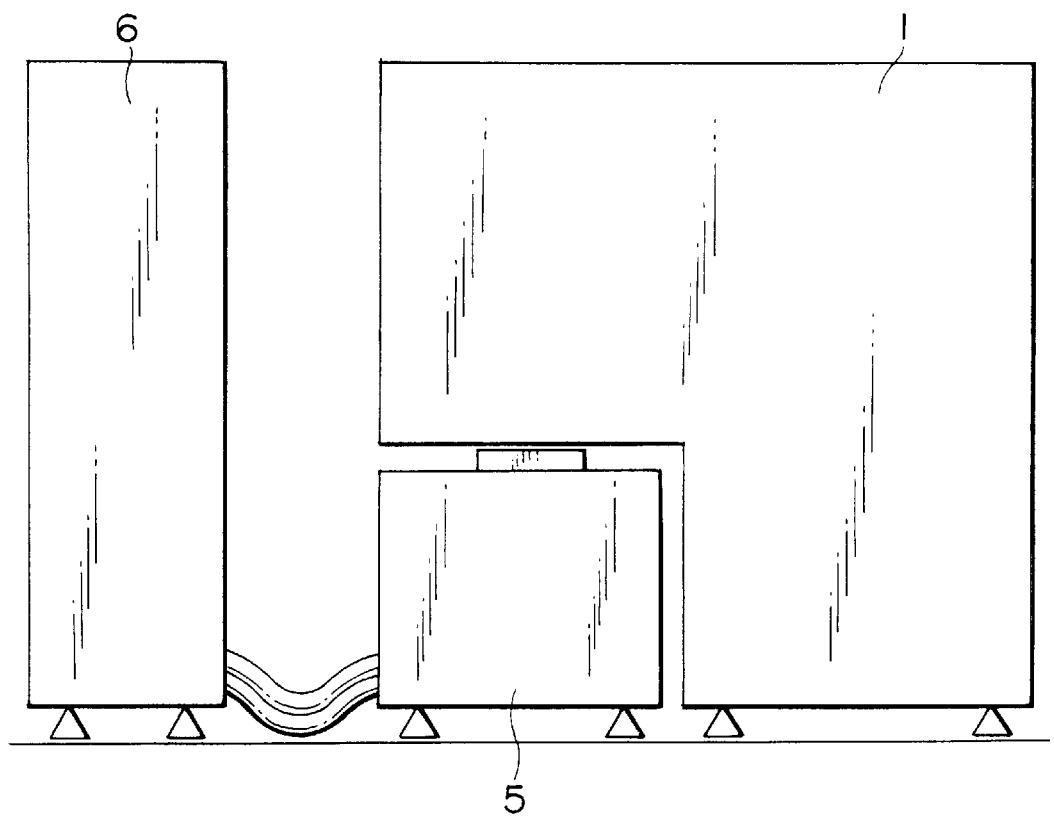
FIG. 2 is a sectional view along the line II—II in FIG. 1.

As shown in FIG. 1, the constant temperature chamber 101 and unsoak chamber 103 of the chamber section 100 are arranged so as to project upward from the test chamber 102. Here, a test tray TST is loaded with the DUTs at the loader section 300 and conveyed to the constant temperature chamber 101. The constant temperature chamber 101 is provided with a vertical conveyor, illustration of which is omitted. A plurality of test trays TST stand by in a state supported by the vertical conveyor until the test chamber 102 becomes empty. While standing by, a high temperature or low temperature thermal stress is applied to the DUTs.

The test chamber 102 has a test head 5 arranged at its center. IC sockets 510 are set so as to approach to the inside of the test chamber 102 from below. A test tray TST is conveyed above the test head 5 and the DUTs are tested by bringing them into electronic contact with the IC sockets 510. The test tray TST finished being tested is treated in the unsoak chamber 103 to return the temperature of the ICs to room temperature, then is discharged to the unloader section 400.

A board 105 is provided between the loader section 300 and the unloader section 400 as shown in FIG. 1, on which test tray conveying apparatus 108 composed of a roller conveyer, etc. are attached. The test tray conveying apparatus 108 attached on the board 105 conveys the test trays TST taken out from the unsoak chamber 103 back to the constant temperature chamber 101 via the unloader section 400 and the loader section 300.

Figure 4:
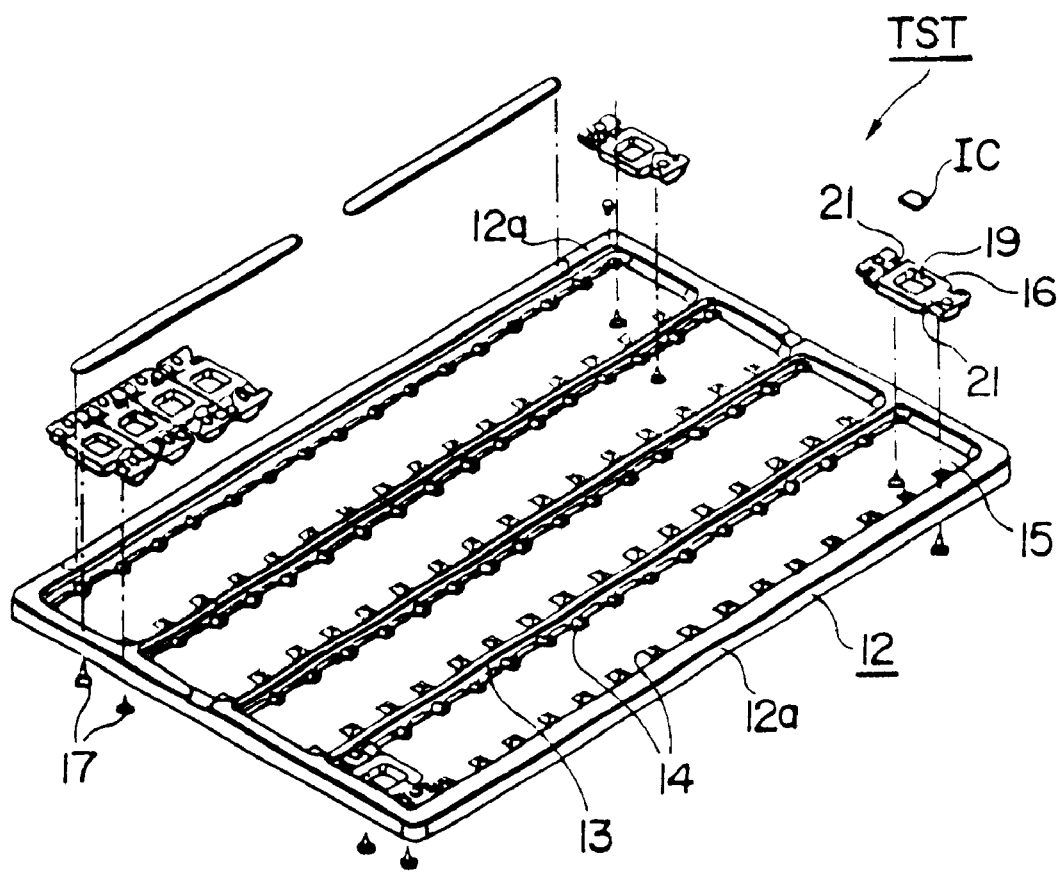
FIG. 4 is a disassembled perspective view of a test tray Used in the electronic component testing apparatus shown in FIG. 1.
Figure 7:
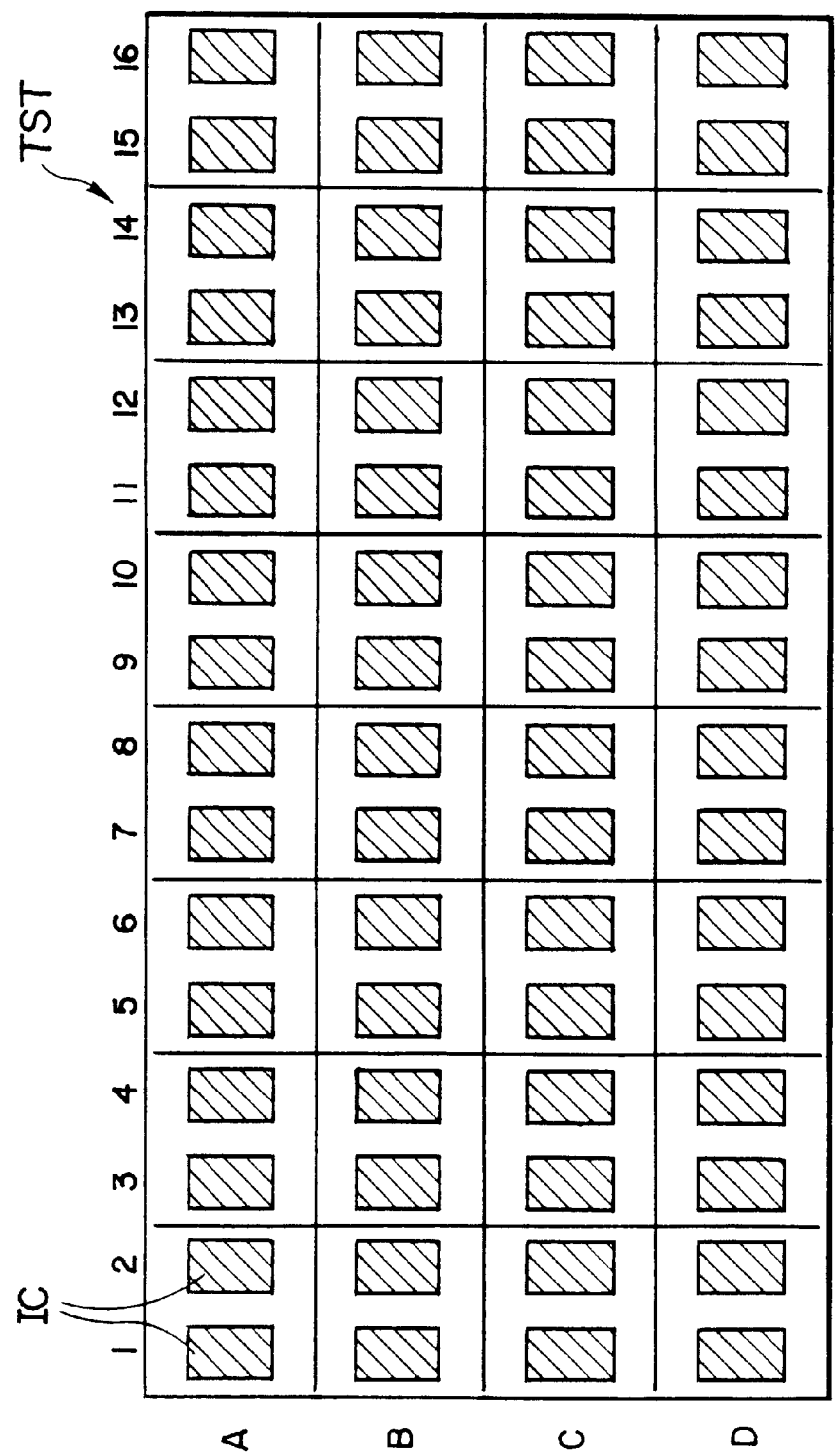
FIG. 7 is a plan view of the test tray for explaining a testing method (a first test step) of the present invention.
Figure 9:
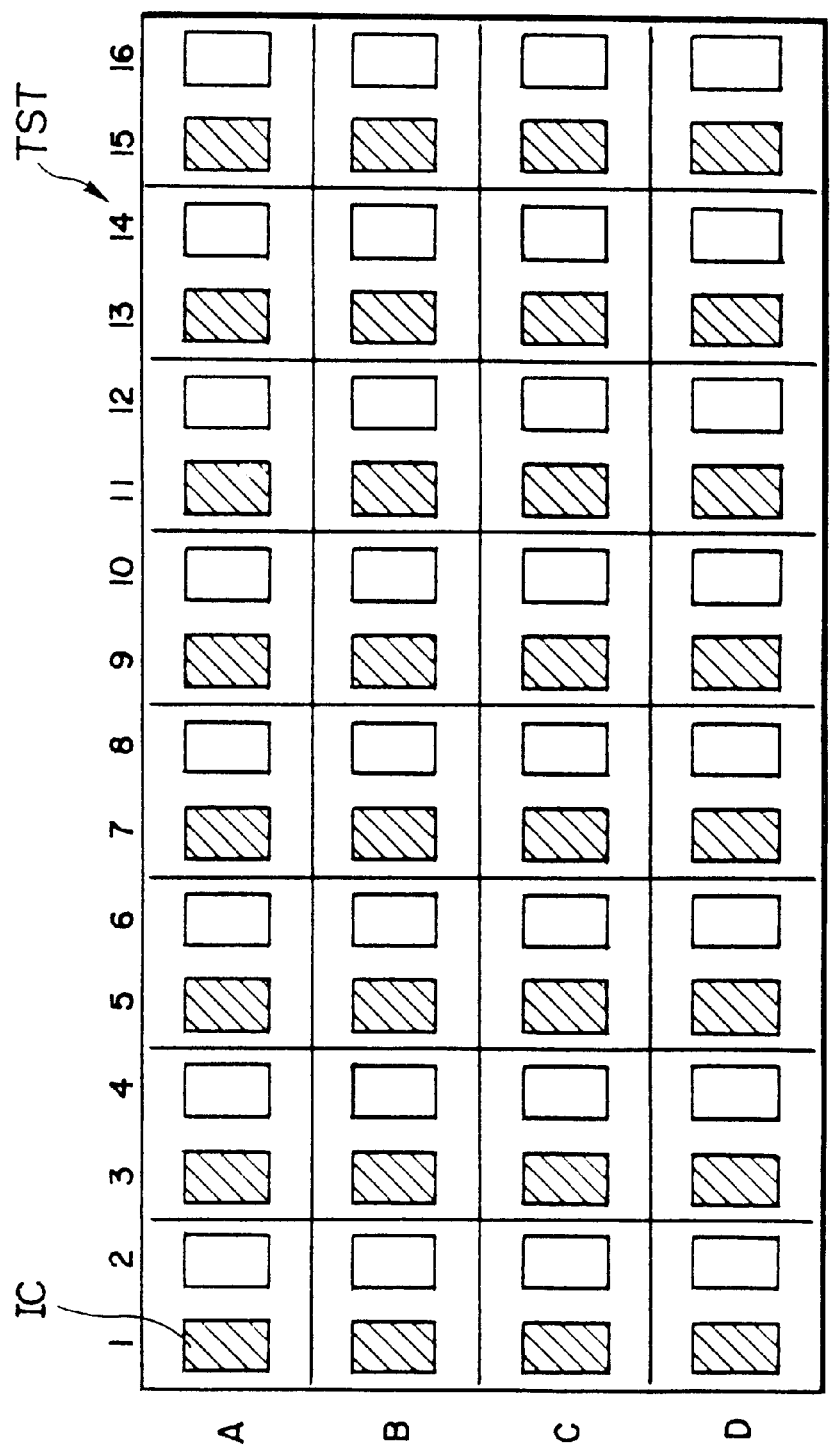
FIG. 9 is a plan view of a test tray for explaining a testing method (a second test step) of the present invention.

Note that in the present embodiment, as shown in FIG. 4 and FIG. 7, one test tray TST is loaded with, for example, 4 lines and 16 rows (64 in total) of DUTs, and the number of DUTs being made simultaneously contact the test head 5 is 64 at a first test (see FIG. 7), while 32 DUTs are simultaneously tested at the time of a re-test mode (see FIG. 9). The test procedure will be explained later on.

The result of the test is stored in an address specified by for example an identification number assigned to the test tray and the number assigned to the DUTs inside the test tray TST. Note that in the present invention, the testing method is not specifically limited to the above procedure and other test procedures may be applied.

Figure 5:
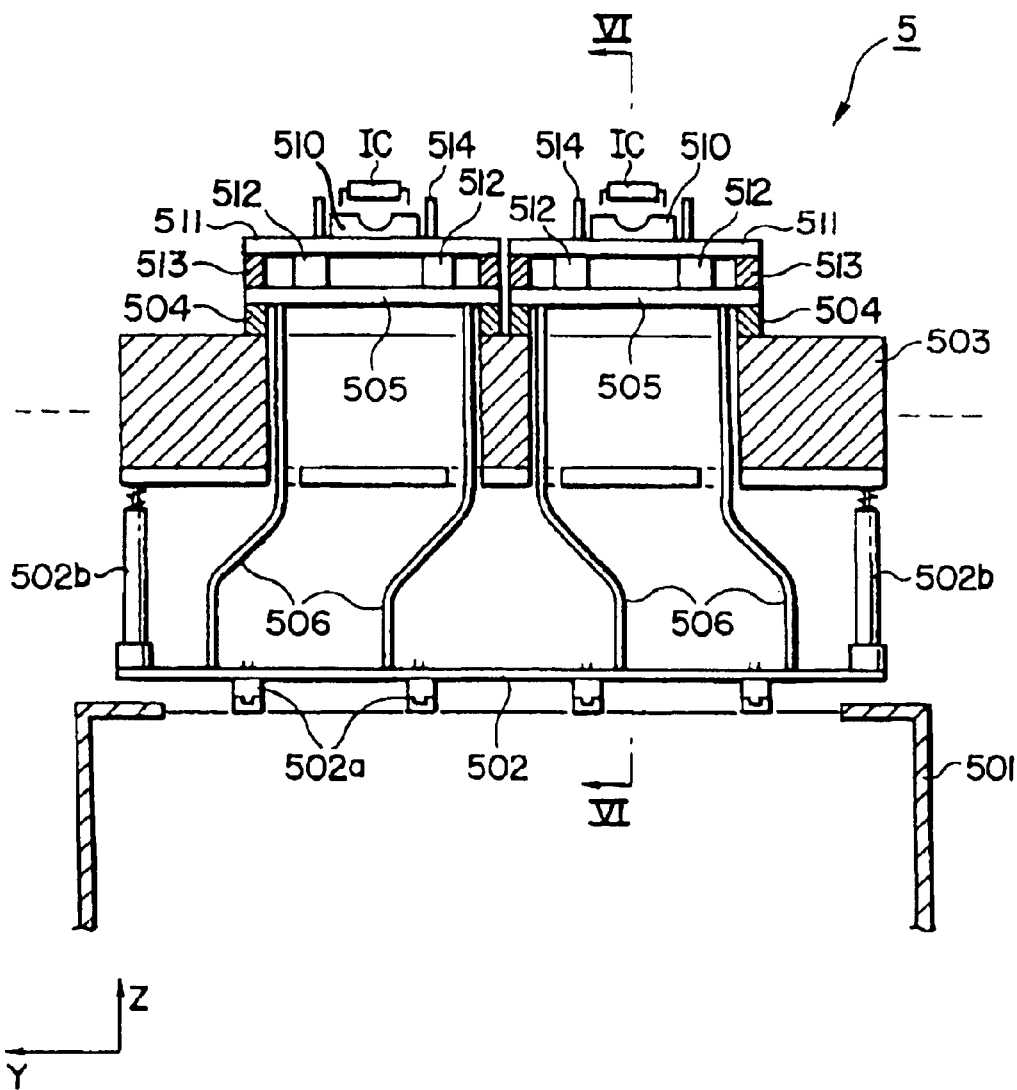
FIG. 5 is a detailed sectional view of a test head in FIG. 1.
Figure 6:
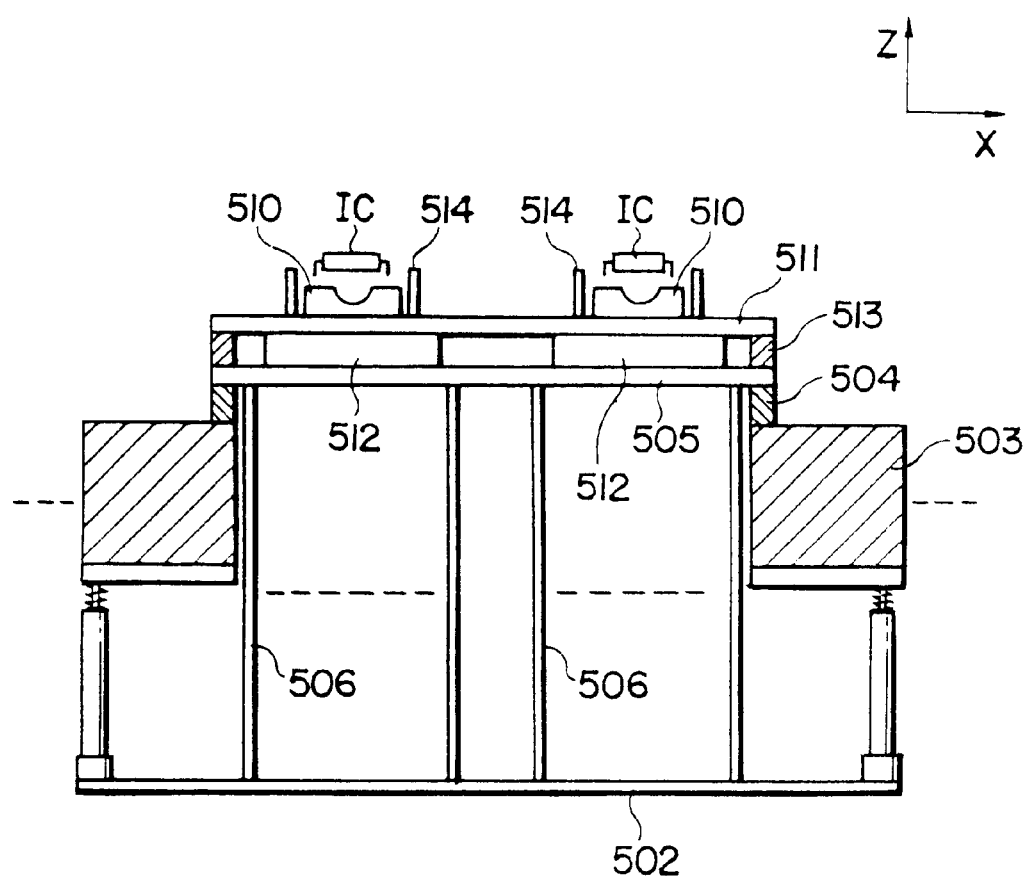
FIG. 6 is a sectional view along the line VI—VI in FIG. 5.

The configuration of the test tray TST and the test head 5 in the test chamber 102 are as below. FIG. 5 is a detailed sectional view of the test head 5 in FIG. 2 and FIG. 6 is a sectional view along the line VI—VI in FIG. 5.

The test head 5 in the present embodiment is mounted a base board 502 above the test head body 501 via a connector 502a, and a spacing frame 503 is provided above the base board 502 via a space pillar 502b which can slightly move upward and downward in the direction of Z-axis.

A socket board 505 is provided over the spacing frame 503 via a socket board spacer 504, and further above is provided a sub-socket board 511 via a sub-socket board spacer 513.

Between the base board 502 and the socket board 505 is connected by a plurality of coaxial cables 506, and between the socket board 505 and the sub-socket board 511 is connected by a relay terminal 512.

Note that FIG. 5 is a sectional view of the test head 5 seeing it toward the direction of X-axis, wherein only two pairs of socket boards 505 and sub-socket boards 511 are shown in the direction of X-axis. However, an actual test head 5 of 4 lines and 16 rows is provided with four pairs of the socket board 505 and sub-socket board 511 in the direction of Y-axis.

FIG. 6 is a sectional view of the test head 5 seeing it toward the direction in Y-axis, wherein only one pair of the socket board 505 and sub-socket board 511 in the direction of X-axis is shown. However, the actual test head 5 of 4 lines and 16 rows is provided with eight pairs of the socket boards 505 and sub-socket boards 511 in the direction in X-axis.

An IC socket 510 and socket guide 514 in accordance with need is provided above the respective sub-socket board 511. The IC socket 510 has a plurality of contact pins to contact input/output terminals of DUTs which are connected to a land, etc. formed on the upper surface of the sub-socket board 511. Further, the socket guide 514 is a guide for determining the positions of DUTs when making the DUTs contact the IC socket 510 and which can be omitted in some cases.

IC Magazine 200

The tray magazine 200 is provided with a pre-test IC stocker 201 for holding DUTs to be tested and a post-test IC stocker 202 for holding DUTs classified in accordance with the test results.

These pre-test IC stocker 201 and post-test IC stocker 202, as shown in FIG. 1, are each comprised of a frame-shaped tray support frame 203 and an elevator 204 able to enter from under the tray support frame 203 and move toward the top. The tray support frame 203 supports in it a plurality of stacked customer trays KST. The stacked customer trays KST are moved up and down by the elevator 204.

The pre-test IC stocker 201 holds stacked customer trays KST on which the DUTs to be tested are held, while the post-test IC stocker 202 holds stacked customer trays KST on which DUTs finished being tested are suitably classified.

Note that since the pre-test IC stocker 201 and the post-test IC stocker 202 are structured the same, the numbers of the pre-test IC stocker 201 and the post-test IC stocker 202 may be suitably set in accordance with need. In the example shown in FIG. 1 and FIG. 3, the pre-test IC stocker 201 is provided with two stockers STK-B and provided next to that with two empty stockers STK-E to be sent to the unloader section 400, while the post-test IC stocker 202 is provided with eight stockers STK-1, STK-2, . . . , STK-8 and can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

The above-mentioned customer tray KST is conveyed to the loader section 300, where the DUTs loaded on the customer tray KST are reloaded on the test tray TST stopped at the loader section 300.

The X-Y conveyor 304 is used as an IC conveying apparatus for reloading the DUTs from the customer tray KST to the test tray TST, as shown in FIG. 1, which is provided with two rails 301 laid over the top of the board 105, a movable arm 302 able to move back and forth (this direction designated as the direction of Y-axis) between the test tray TST and a customer tray KST by these two rails 301, and a movable head 303 supported by the movable arm 302 and able to move in the direction of X-axis along the movable arm 302.

The movable head 303 of the X-Y conveyor 304 has suction heads attached facing downward. The suction heads move while drawing out air to pick up the DUTs from the customer tray KST and reload the DUTs on the test tray TST. For example, about eight suction heads are provided for the movable head 303, so it is possible to reload eight DUTs at one time on the test tray TST.

Note that in a general customer tray KST, indentation pocket KST1 for loading the DUTs are formed relatively larger than the shapes of the DUTs, so the positions of the DUTs in a state held on the customer tray KST can vary largely. Therefore, if the DUTs are picked up by the suction heads and conveyed directly to the test tray TST in this state, it becomes difficult for the ICs to be dropped accurately into the IC receiving indentations formed in the test tray TST.

Therefore, in the electronic devices testing apparatus 1 of the present embodiment, an IC position correcting means called a preciser 305 is provided between the set position of the customer tray KST and the test tray TST. This preciser 305 has relatively deep indentations surrounded with inclined surfaces at their circumferential edges, so when DUTs picked up by the suction heads are dropped into these indentations, the drop positions of the DUTs are corrected by the inclined surfaces. Due to this, the positions of the eight DUTs with respect to each other are accurately set and it is possible to pick up the correctly positioned DUTs by the suction heads once again and reload them on the test tray TST and thereby reload the DUTs precisely in the IC receiving indentations formed in the test tray TST.

As shown in FIG. 1, the board 105 of the loader section 300 is provided with a pair of openings 306, 306 arranged so that the customer trays KST carried to the loader section 300 can be brought close to the top surface of the board 105. While not illustrated, each of the openings 306 are provided with a holding hook for holding the customer tray KST conveyed to the opening 306, and the customer tray KST is held in the position that the top surface thereof faces the surface of the board 105 via the opening 306.

Further, an elevator table for elevating or lowering a customer tray KST is provided below the openings 306. A customer tray KST emptied after reloading of the DUTs to be tested is placed on here and lowered and the empty tray is passed to the lower tray magazine of the tray transfer arm 205.

Unloader Section 400

The unloader section 400 is provided with X-Y conveyors 404, 404 of the same structure as the X-Y conveyor 304 provided at the loader section 300. The X-Y conveyors 404, 404 reload the post-test ICs from the test tray TST carried out to the unloader section 400 to the customer tray KST.

The board 105 of the unloader section 400 is provided with two pairs of openings 406, 406 arranged so that the customer trays KST carried to the unloader section 400 can be brought close to the top surface of the board 105. Each of the openings 406 is provided with a holding hook for holding the customer tray KST conveyed to the opening 406, and the customer tray KST is held in the position that the top surface thereof faces the surface of the board 105 via the opening 406.

An elevator table for elevating or lowering a customer tray KST is provided below the openings 406. A customer tray KST becoming full after being reloaded with the tested DUTs is placed on here and lowered and the full tray is passed to the lower tray magazine of the tray transfer arm 205.

Note that in the electronic devices testing apparatus 1 of the present embodiment, while there are a maximum of eight types of sortable categories, it is only possible to arrange a maximum of four customer trays KST at the openings 406 of the unloader section 400. Therefore, there is a limit of four sortable categories in real time. In general, four categories are sufficient, i.e., good ICs can be classified into high speed response devices, medium speed response devices, and low speed response devices plus defective devices, but there may also arise categories not belonging to these categories such as devices requiring retesting.

In this way, when DUTs arise which are classified into a different category than the categories given to four customer trays arranged at the openings 406 of the unloader section 400, one customer tray KST may be returned from the unloader section 400 to the IC magazine 200 and a customer tray KST to hold DUTs of the newly arising category may be transferred to the unloader section 400 in its place so as to hold these DUTs.

If customer trays KST are switched in the middle of sorting work, the sorting work has to be interrupted during that time and therefore there is the problem of a reduction in the throughput. Therefore, in the electronic devices testing apparatus 1 of the present embodiment, a buffer section 405 is provided between the test tray TST and the opening 406 of the unloader section 400, and DUTs of a category rarely appearing are stored temporarily at this buffer section 405.

For example, the buffer section 405 is given a capacity able to hold 20 to 30 or so DUTs and a memory is provided for storing the category of ICs held at the IC holding locations of the buffer section 405. The categories and positions of the DUTs temporarily stored at the buffer section 405 are stored for each DUT. In the intervals of the sorting work or when the buffer section 405 has become full, customer trays KST of the categories to which the DUTs stored at the buffer section 405 belong are called up from the IC magazine 200 and the ICs are loaded on these customer trays KST. At this time, sometimes the DUTs temporarily stored at the buffer section 405 span several categories, but at this time it is sufficient to call up several customer trays KST at one time from the openings 406 of the unloader section 400 when calling up customer trays KST.

Tray Transfer Arm 205

As shown in FIG. 1, the upper portion of the pre-test IC stocker 201 and post-test IC stocker 202, there is provided a tray transfer arm 205 which moves all over the range of the pre-test stocker 201 and the post-test stocker 202 in the direction they are aligned between the board 105. In this example, since openings 306 and 406 of the loader section 300 and the unloader section 400 are formed immediately above the pre-test IC stocker 201 and post-test IC stocker 202 (without deviating in the Y-axis direction), the tray transfer arm 205 is also movable only in the directions of X-axis and Y-axis. Note that in accordance with the positional relationship of the tray magazine 200 and the loader section 300 or the unloader section 400, the tray transfer arm 205 may be made to be movable in all directions of X, Y and Z axises.

The tray transfer arm 205 is provided with a pair of tray magazines for holding the customer trays being in an alignment to the left and the right to each other, and transfers the customer trays between the loader section 300 and the unloader section 400 and between the pre-test IC stocker 201 and post-test IC stocker 202.

Next, a test procedure of the test chamber 102 will be explained.

Figure 8:
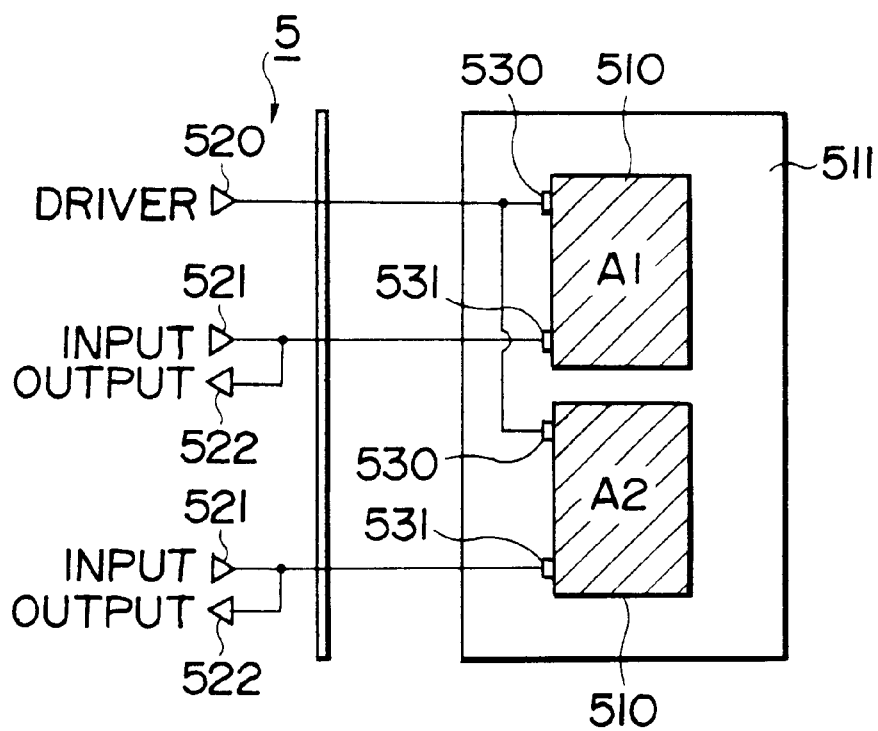
FIG. 8 is a conceptual view of the connection relationship of a test head and sockets for explaining a testing method (a first test step) of the present invention.
Figure 10:
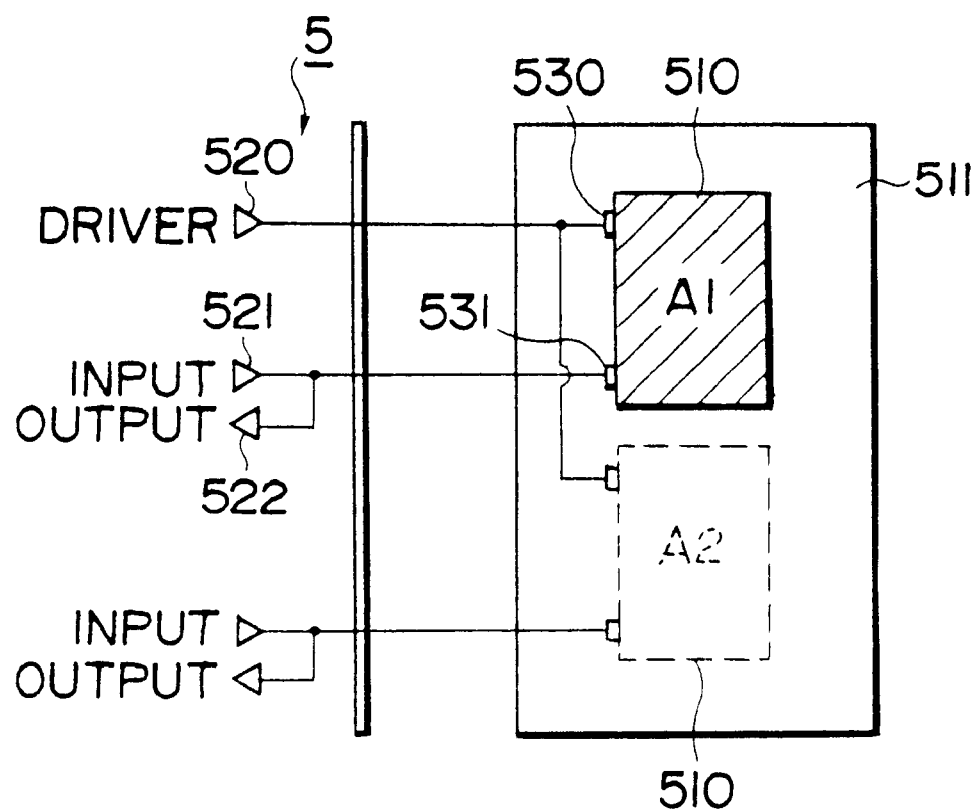
FIG. 10 is a conceptual view of the connection relationship of a test head and sockets for explaining a testing method (a second test step) of the present invention.

Note that FIG. 7 and FIG. 9 are schematic views of the test tray TST shown in FIG. 4, and FIG. 8 and FIG. 10 are schematic views of one of a group of electronic devices in the plurality of DUTs shown in FIG. 7 and FIG. 9.

Figure 12:
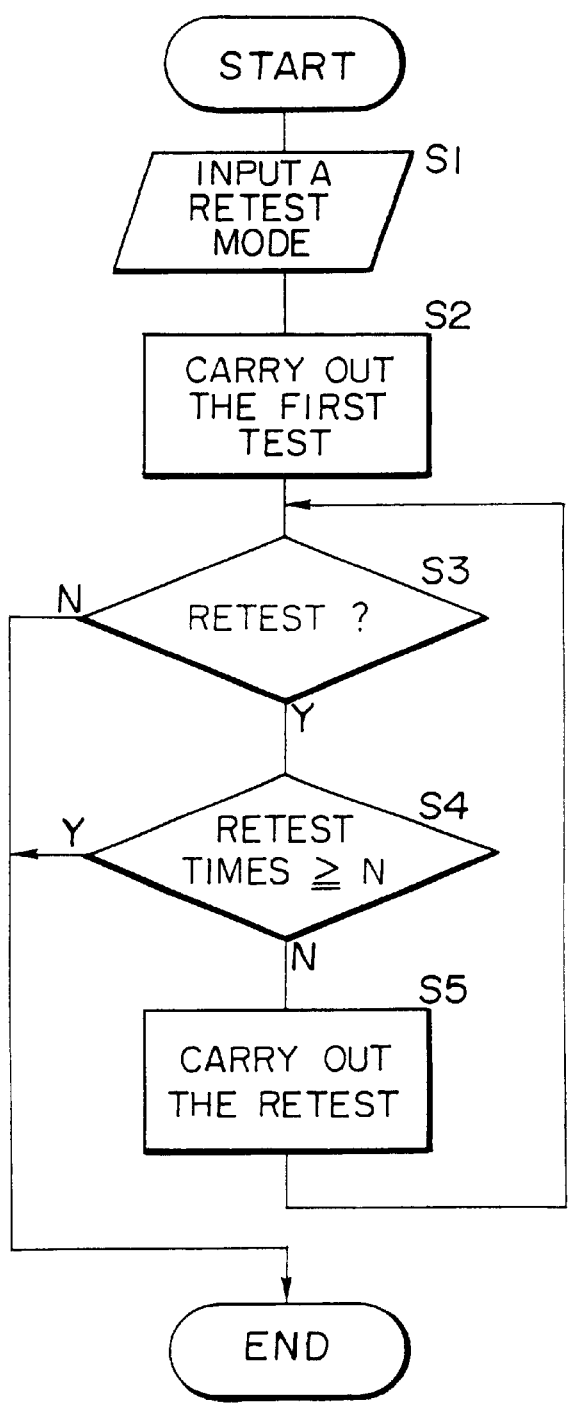
FIG. 12 is a flow chart of an embodiment of a testing method of the present invention.
Figure 13:
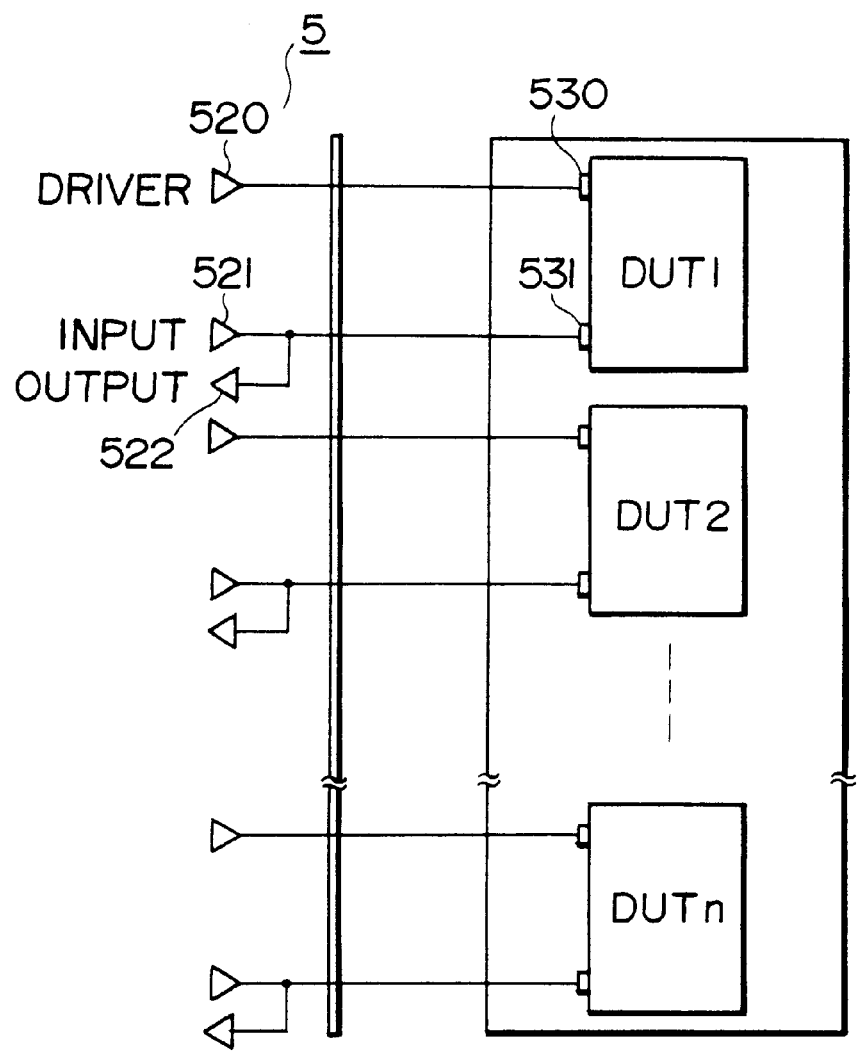
FIG. 13 is a conceptual view of the connection relationship of a test head and sockets of an electronic component testing apparatus of the related art.
Figure 14:
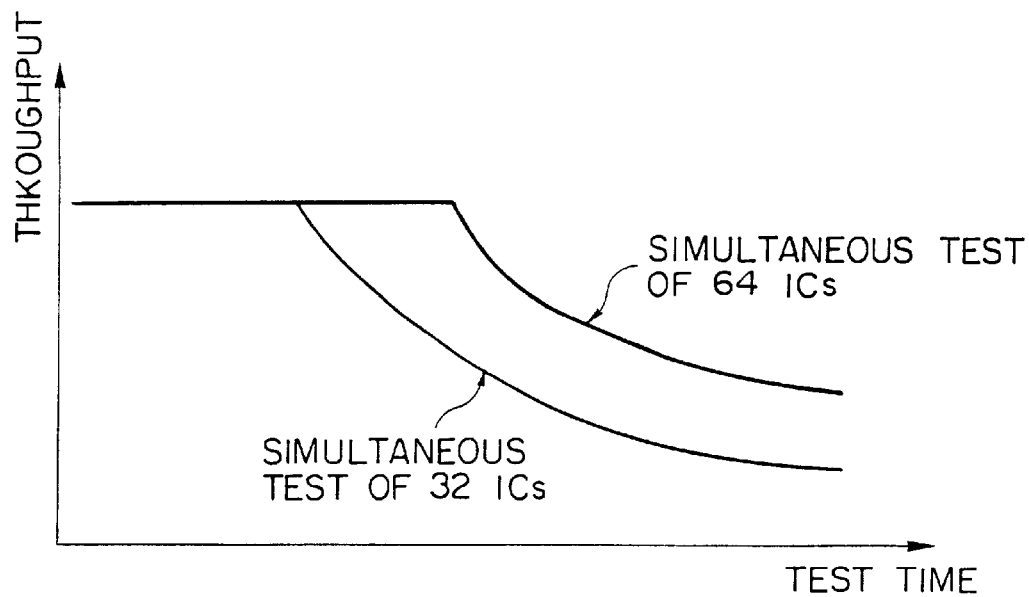
FIG. 14 is a graph of the relationship of a test time and a throughput.

First, the first test is carried out after inputting a reinspection mode to a controller of the handler 1 (steps 1 and 2 in FIG. 12). In the first test, as shown in FIG. 7, all of the 64 of DUTs loaded on the test tray TST are simultaneously tested by being pressed against the respective IC sockets 510.

At this time, in the present embodiment, as shown in FIG. 7, the 64 of DUTs, A1, A2, . . . , D15, D16, are handled that adjacent two DUTs to each other are one group of electronic devices. In an example in the same figure, A1 and A2, A3 and A4, . . . divided by solid lines are regarded as an electronic devices group. FIG. 8 is a view of the connection relationship of the test head 5 in one electronic devices group treated as such and terminals of the IC socket 510, wherein DUTs illustrated side by side in FIG. 7 are illustrated by being placed lengthwise for convenience of showing the wiring relationship.

As shown in FIG. 8, two DUTs (A1, A2) composing one electronic devices group are simultaneously pressed against two IC sockets 510 and 510 provided on the same socket board 511.

Here, a driving signal sent from the test head 5 side to the IC side is sent from a driver pin 520 on the test head 5 side and branched in parallel by a wiring pattern of the socket board 511 and respectively input to the driver terminals 530 of the two ICs (A1, A2) via contact pins. While, an input signal sent from the test head 5 side to the IC side is sent from two input signal pins 521 on the test head 5 side and respectively input to input/output terminals of the ICs (A1, A2) via the wiring pattern and contact pins of the socket board 511. The input signals input to the input/output terminals of the two ICs (A1, A2) are respectively read from the same input/output terminals 531 and 531, output to two output signal pins 522, 522 on the test head 5 side and sent therefrom to a tester 6.

By comparing the output signals detected by the output signal pins 522, 522 with the input signals input from the input signal pins 521, 521, it is judged whether a function at the address operated correctly when they are memory ICs.

Here, when an abnormal signal is detected in at least either one of the ICs composing one group of electronic devices, all ICs in the electronic devices group are sorted into a category being required a reinspection. Namely, when being reloaded to customer trays KST in the unloader section 400, they are reloaded to a customer tray KST of a category of a reinspection.

Namely, in the present embodiment, two ICs are set on one socket board 511 and driving signals of the same are made common, so when the output signal is normal, both of the ICs can be judged good, while when the output signal is abnormal, it is impossible to judge which IC (A1 or A2) is defective.

Therefore, at the time of the first test of the above one group of electronic devices composed of two ICs, when there is an abnormal signal in the output signal, both of the ICs (A1, A2) are sorted as ICs (A1, A2) in need of reinspection. Then, when test of all DUTs are completed, it proceeds to a step 3 in FIG. 12 to confirm if there is a DUT being required a re-test, and a re-test is carried out when there is a DUT in need of the re-test. (Step 5). Note that when the number of reinspection becomes more than a predetermined number N, the re-test is not carried out furthermore and the processing ends.

In the re-test procedure, the customer tray KST loaded with the DUTs in need of the re-test is conveyed to the loader section 300 where the DUTs are loaded to the test tray TST as shown in FIG. 9. Namely, DUTs are loaded on all of pockets in the first test, while in the re-test, since it is necessary to judge which one of the above two ICs (A1, A2) are defective, the DUTs are loaded on the test tray TST in order that one IC is pressed against one socket board 511 wherein the driver pin 520 is made common.

Then, as shown in FIG. 10, one socket board 511 is pressed by only one IC (here, A1) so the driving signal from the driver pin 520 is output to one IC (A1) and the input signal and the output signal are accessed to the only one IC (A1), therefore, it is possible to judge which IC is good or defective. Then, the ICs after the re-test are sorted to categories in accordance with the results.

As explained above, in the electronic device testing apparatus 1 of the present embodiment, one driver pin 520 can be commonly used for two IC sockets 510, so the number of DUTs capable to be simultaneously tested can be increased without increasing the number of terminals on the test head 5 side. Particularly, along with the recent remarkable improvement in controlling qualities in producing ICs, the rate of good devices has become high, therefore, the possibility that one of two ICs are defective is quite low.

Thus, according to the testing method of the present embodiment, it seems that the number of tests increases for the number of re-tests required at a glance, comparing with the testing method of the related art. However, in reality, the number of DUTs in need of the re-test is extremely small and the throughput contrarily improves by the increase of the number of DUTs capable of simultaneously being tested.

Note that the embodiments explained above were described to facilitate the understanding of the present invention and not to limit the present invention. Accordingly, elements disclosed in the above embodiments include all design modifications and equivalents belonging to the technical field of the present invention.

Figure 11:
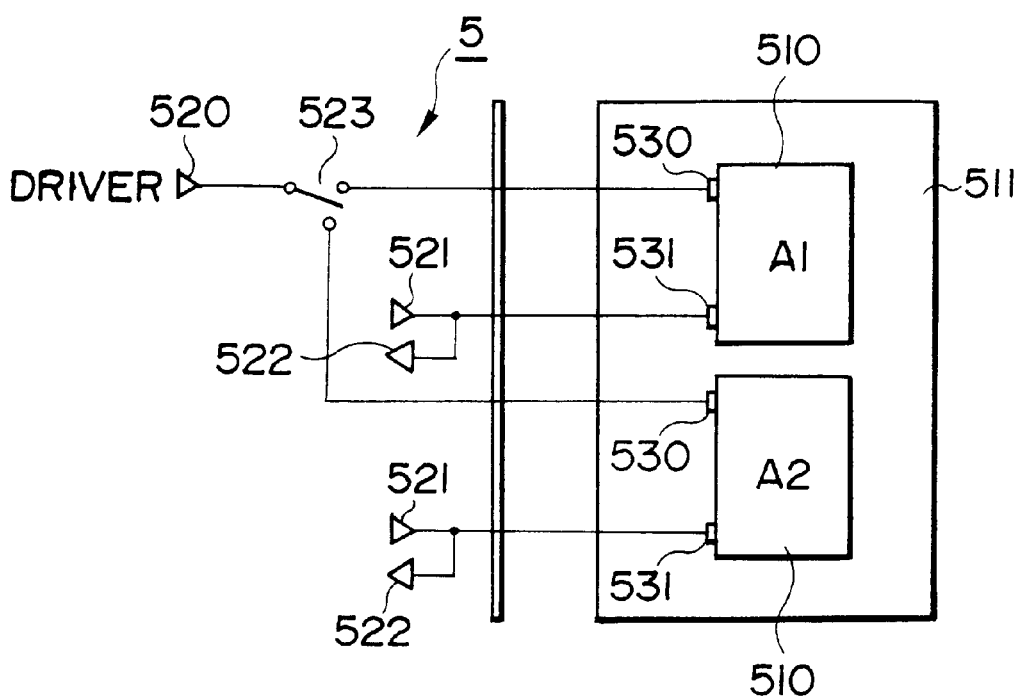
FIG. 11 is a conceptual view of another embodiment of the connection relationship of a test head and sockets of the present invention.

For example, when making the driver pin 520 on the test head 5 side common, wiring on the socket board 511 side was made parallel as shown in FIG. 8 in the embodiment, however, the present invention is not specifically limited to this and can be configured as shown in FIG. 11. Namely, in FIG. 11, one driver pin 520 on the test head 5 side is provided with a switch 523 on the test head 5 side for branching, and the socket board 511 is connected a driving signal line for each of them. Then, when outputting a driving signal to one of ICs (A1), the switch on the test head 5 side is switched to the IC (A1) side, while when outputting a driving signal to the other IC (A2), the switch is switched to the IC (A2) side in the same way.

Even in the above case, one driver pin 520 can be commonly used by two IC sockets 510, so it becomes possible to increase the number of ICs simultaneously tested without increasing the number of terminals of the test head 5 side.

Also, in the above embodiment, a group of electronic devices (A1, A2) judged to be in need of a reinspection in the first test procedure is conveyed out from the test chamber to the unloader section 400, temporarily sorted to a category in need of a reinspection, then transferred from the loader section 300 again to the test chamber 102, where the reinspection as a second test procedure is carried out. However, in the testing method of the present invention, the group of electronic devices judged to be in need of a reinspection in the first test procedure may be immediately subjected to the reinspection as a second test procedure at that position.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of testing a plurality of electronic components to measure simultaneously function of the plurality of electronic components' circuit and to judge simultaneously whether the electronic components are respectively good or defective in accordance with each response output signal by inputting a test signal correspond to an actual movement condition signal of the electronic components to each the electronic component to be tested via IC sockets, the method comprising:

(A) a step of setting the plurality of the electronic components to the IC sockets, (B) a first test step of
  (B-1) branching a driving signal in parallel to two driving signals or more correspond to an actual movement condition signal of the electronic components sent from the test head,
  (B-2) inputting the branched driving signals in parallel to driving terminals of the respective adjoining electronic components of a group of electronic components composed of the plurality of electronic components, and
  (B-3) judging simultaneously in accordance with a response signal of the driving signal outputting from input/output terminals whether the group of electronic components subjected to the test is good or defective as a whole, (C) a step of categorizing the group of electronic components judged to be defective as a retest group if any one of the electronic components composed of the group is judged to be defective in the first test step, (D) a step of
  (D-1) carrying the group of electronic components judged to be good out from the IC sockets and
  (D-2) rearranging the group of electronic components categorized as the retest group in the step of categorizing, the group of electronic components being rearranged to the IC sockets so that a retest driving signal is input to a respective electronic component of the group; and (E) a second test step of
- (E-1) branching the retest driving signal in parallel to two retest driving signals or more correspond to an actual movement condition signal of the electronic components sent from the test head,
- (E-2) inputting mutually independently the retest driving signals to the driving terminals of the respective electronic components of the retest group via the IC socket, and
- (E-3) judging simultaneously in accordance with a response signal of the driving signal outputting from the input/output terminals whether each of the electronic components subjected to the retest is good or defective.

2. The method of testing a plurality of electronic components as set forth in claim 1, wherein N number of electronic components with N being a natural number are simultaneously tested in said first test step and N/2 number of electronic components are simultaneously tested in said second test step.

* * * * *